United States Patent
Jenkins et al.

(10) Patent No.: US 7,525,325 B1
(45) Date of Patent: Apr. 28, 2009

(54) SYSTEM AND METHOD FOR FLOATING-SUBSTRATE PASSIVE VOLTAGE CONTRAST

(75) Inventors: Mark W. Jenkins, Albuquerque, NM (US); Edward I. Cole, Jr., Albuquerque, NM (US); Paiboon Tangyunyong, Albuquerque, NM (US); Jerry M. Soden, Placitas, NM (US); Jeremy A. Walraven, Albuquerque, NM (US); Alejandro A. Pimentel, Albuquerque, NM (US)

(73) Assignee: Sandia Corporation, Alburquerque, NM (US)

( * ) Notice: Subject to any disclaimer, the term of this patent is extended or adjusted under 35 U.S.C. 154(b) by 0 days.

(21) Appl. No.: 11/640,720

(22) Filed: Dec. 18, 2006

(51) Int. Cl.
*G01R 31/305* (2006.01)
*G01R 31/26* (2006.01)
*G01N 23/00* (2006.01)

(52) U.S. Cl. .................. 324/751; 438/17; 250/306; 250/307; 250/308; 250/309; 250/310

(58) Field of Classification Search ............... 324/751; 438/17; 250/306–311
See application file for complete search history.

(56) References Cited

U.S. PATENT DOCUMENTS

| | | | | |
|---|---|---|---|---|
| 4,912,052 A | * | 3/1990 | Miyoshi et al. | 324/751 |
| 4,980,639 A | * | 12/1990 | Yoshizawa et al. | 324/751 |
| 5,602,489 A | * | 2/1997 | El-Kareh et al. | 324/751 |
| 5,781,017 A | * | 7/1998 | Cole et al. | 324/751 |
| 6,091,249 A | * | 7/2000 | Talbot et al. | 324/751 |
| 6,204,075 B1 | * | 3/2001 | Kikuchi | 438/18 |
| 6,476,388 B1 | * | 11/2002 | Nakagaki et al. | 250/310 |
| 6,559,663 B2 | * | 5/2003 | Shinada et al. | 324/751 |
| 6,608,305 B1 | * | 8/2003 | Kin et al. | 250/306 |
| 6,812,050 B1 | | 11/2004 | Ramappa | |
| 6,853,204 B2 | * | 2/2005 | Nishiyama et al. | 324/751 |
| 6,906,538 B2 | | 6/2005 | Patterson et al. | |
| 6,960,802 B1 | * | 11/2005 | Mahanpour et al. | 257/300 |

(Continued)

OTHER PUBLICATIONS

Jim Colvin, "A New Technique to Rapidly Identify Low Level Gate Oxide Leakage in Field Effect Semiconductors Using a Scanning Electron Microscope", Proceedings of the International Symposium for Testing and Failure Analysis, 1990, pp. 331-336.

(Continued)

*Primary Examiner*—Ha Tran T Nguyen
*Assistant Examiner*—Karen M Kusumakar
(74) *Attorney, Agent, or Firm*—John P. Hohimer

(57) ABSTRACT

A passive voltage contrast (PVC) system and method are disclosed for analyzing ICs to locate defects and failure mechanisms. During analysis a device side of a semiconductor die containing the IC is maintained in an electrically-floating condition without any ground electrical connection while a charged particle beam is scanned over the device side. Secondary particle emission from the device side of the IC is detected to form an image of device features, including electrical vias connected to transistor gates or to other structures in the IC. A difference in image contrast allows the defects or failure mechanisms be pinpointed. Varying the scan rate can, in some instances, produce an image reversal to facilitate precisely locating the defects or failure mechanisms in the IC. The system and method are useful for failure analysis of ICs formed on substrates (e.g. bulk semiconductor substrates and SOI substrates) and other types of structures.

28 Claims, 6 Drawing Sheets

U.S. PATENT DOCUMENTS

| | | | |
|---|---|---|---|
| 6,980,011 B1 * | 12/2005 | Chowdhury et al. | 324/751 |
| 6,991,946 B1 | 1/2006 | Mahanpour et al. | |
| 7,078,690 B2 * | 7/2006 | Simon et al. | 250/310 |
| 2002/0149381 A1 * | 10/2002 | Lo et al. | 324/751 |

OTHER PUBLICATIONS

Jim Colvin, "The Identification and Analysis of Latent ESD Damage on CMOS Input Gates", EOS/ESD Symposium, 1993, pp. 109-118.

Jon C. Lee et al, "Investigation of Sensitivity Improvement on Passive Voltage Contrast for Defect Isolation," Microelectronics Reliability, vol. 42, 2002, pp. 1707-1710.

Mark W. Jenkins et al, "Floating Substrate Passive Voltage Contrast (FSPVC)," Presented at the 32nd International Symposium for Testing and Failure Analysis, Nov. 12-16, 2006.

* cited by examiner

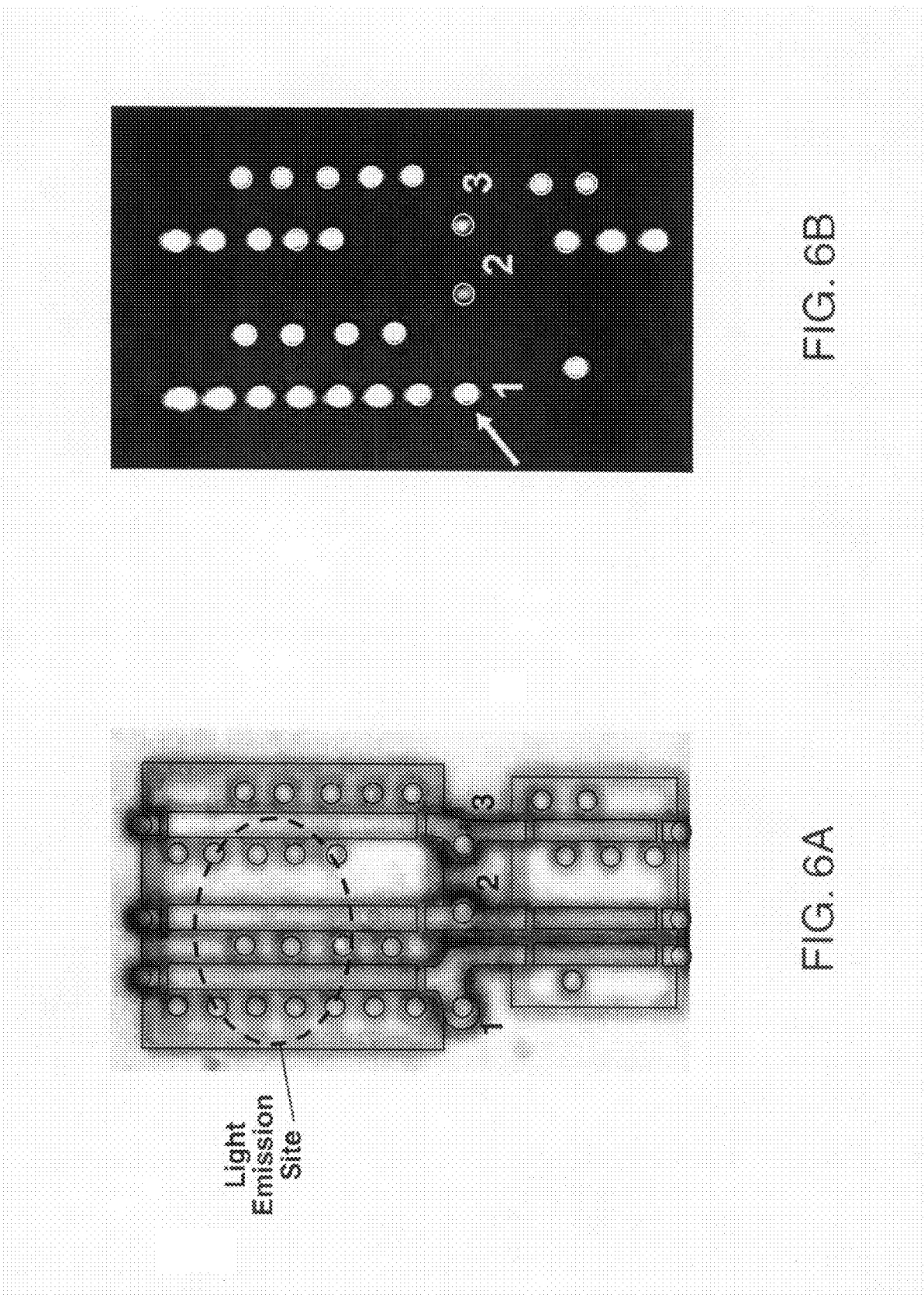

SYSTEM AND METHOD FOR FLOATING-SUBSTRATE PASSIVE VOLTAGE CONTRAST

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to systems and methods for detecting defects and failure mechanisms in semiconductor integrated circuits (ICs), and in particular to a floating-substrate passive voltage contrast (PVC) failure analysis system and method that can be used to detect defects and failure mechanisms in ICs formed on bulk semiconductor or silicon-on-insulator (SOI) substrates, and other types of structures.

BACKGROUND OF THE INVENTION

Passive voltage contrast (PVC) is a failure analysis tool which can be used to detect defects and failure mechanisms in complementary metal oxide semiconductor (CMOS) ICs such as a gate oxide breakdown. In the PVC method, a scanning electron microscope (SEM) can be used to direct a beam of electrons onto the IC which is located on a stage in a vacuum chamber, with a substrate on which the IC is formed being electrically grounded. The beam of electrons incident on the IC produces secondary electrons which can be detected to form a PVC image of the IC. The amount of secondary electrons generated in the IC will depend upon local electric fields in and near the surface of the IC, with the electric fields, in turn, depending upon the presence or absence of electrically conducting paths between circuit elements of the IC and the electrically-grounded substrate. Variations in the local electric fields (termed voltage contrast) result in variations in image contrast and are responsible for certain areas of the IC such as gate oxide regions appearing relatively bright (i.e. light) in the PVC image when there is an electrical breakdown therein which forms a conductive path to the grounded substrate, or relatively dark in the absence of any electrical breakdown.

Conventional wisdom has held that the PVC method cannot be performed on electrically-floating ICs such as ICs fabricated on SOI substrates which include a silicon device layer (also termed a body) separated from an underlying silicon substrate by an intervening electrically-insulating oxide layer. In order to apply the PVC method to SOI devices, the body, which is electrically isolated from the substrate, must be electrically grounded in some way. Electrically grounding the body of a SOI device while performing PVC analysis requires extensive pre-processing.

When the PVC analysis is performed on a top side of the SOI device, the device layer must be electrically grounded to the substrate below. This requires removing the various layers of interconnect metallization from the top side of the SOI device. Then additional pre-processing is required to mechanically grind through the silicon substrate from a bottom side thereof, followed by etching through the oxide layer to expose a portion of the body, and then applying an electrically conductive coating over the exposed portion of the body, oxide layer and substrate to form an electrical connection between the body and the electrically grounded substrate (see U.S. Pat. No. 6,960,802).

Performing PVC analysis from the bottom side of a SOI device has also been performed. However, this also requires extensive pre-processing as described in U.S. Pat. No. 6,991,946. In this case, electrical grounding of the body of a packaged SOI device is simplified since one or more pins on the IC package can be used to electrically ground the body. However, in a packaged device, access of the electron beam to the body requires grinding through the substrate from the bottom side, and then etching through the oxide layer to expose the body.

Another PVC method which has been applied to electrically-floating ICs requires the use of two alternating pulsed charged particle beams (e.g. electron beams) with different electron beam energies which are directed to two different portions of the IC to detect continuity defects between any two closely-spaced conductors (see U.S. Pat. No. 6,906,538). One of the charged particle beams creates a stream of secondary electrons at the particular component that the beam is striking; and the other charged particle beam is of a sufficiently elevated voltage to provide an electrical charge at the particular component that it is striking. To avoid interference between the two beams, an alternating pulsating sequencing of the two beams is necessary. This method is complicated and requires a specialized dual-beam system to provide the two pulsed charged particle beams.

The present invention overcomes the limitations of the prior art by providing a PVC system and method that can be used to analyze ICs for defects and failure mechanisms without extensive pre-processing.

The PVC system and method of the present invention, which is referred to as floating-substrate PVC or FSPVC, does not require electrical grounding of the device side of an IC, and can be applied to both bulk semiconductor substrates and SOI substrates.

The PVC system and method of the present invention simplifies pre-processing prior to analysis, and can also be performed using only a single charged particle beam (e.g. a single electron or ion beam).

These and other advantages of the present invention will become evident to those skilled in the art.

SUMMARY OF THE INVENTION

The present invention relates to a method for measuring passive voltage contrast (PVC) on a device side of a semiconductor die which comprises the steps of maintaining the device side of the semiconductor die in an electrically-floating condition without any ground electrical connection; directing a beam of charged particles at the device side of the semiconductor die, and scanning the beam of charged particles over the device side of the semiconductor die; and detecting a secondary particle emission from the device side of the semiconductor die.

The semiconductor die can comprise either a bulk semiconductor substrate or a silicon-on-insulator (SOI) substrate. In preparation for using the method of the present invention, a polishing step can be performed to polish the semiconductor die on the device side thereof down to a first metal layer which comprises a plurality of vias.

The step of maintaining the device side of the semiconductor die in the electrically-floating condition can comprise mounting the semiconductor die on an electrically-insulating sample holder (e.g. for a bulk semiconductor substrate). The step of maintaining the device side of the semiconductor die in the electrically-floating condition can also comprise providing an electrically-insulating adhesive (e.g. an epoxy) between the semiconductor die and an electrically-conducting sample holder.

The step of directing the beam of charged particles at the device side of the semiconductor die can comprise directing a beam of electrons having an energy of generally less than or equal to one thousand electron volts ($\leq 1$ keV), and a current of generally less than or equal to 20 picoAmperes ($\leq 20$ pA). In some cases, the beam of electrons can have an energy in the range of 0.3-0.5 keV.

The step of detecting the secondary particle emission from the device side of the semiconductor die can comprise detecting the secondary particle emission to locate a defect or failure mechanism in a transistor or other structure located on the device side of the semiconductor die.

The step of scanning the beam of charged particles over the device side of the semiconductor die can comprise scanning the beam of charged particles for sufficient time to establish a positive or negative equilibrium charge on the device side of the semiconductor die. The step of scanning the beam of charged particles over the device side of the semiconductor die can also comprise scanning the beam of charged particles at two different scan rates at two different times. The two different scan rates can be, for example, in a ratio of 80:1 or more. The steps of scanning the beam of charged particles over the device side of the semiconductor die at the two different scan rates and detecting the secondary particle emission from the device side of the semiconductor die can also be repeated multiple times for signal averaging.

The present invention also relates to a method for measuring PVC on a device side of a semiconductor die which comprises the steps of maintaining the device side of the semiconductor die in an electrically-floating condition without any ground electrical connection while directing a beam of charged particles at the device side of the semiconductor die; scanning the beam of charged particles over the device side of the semiconductor die at two different scan rates (e.g. in a ratio of at least 80:1); detecting a secondary particle emission from the device side of the semiconductor die at the two different scan rates; and comparing the secondary particle emission from the device side of the semiconductor die at the two different scan rates to locate an area of the device side where a difference in the secondary particle emission at the two different scan rates is largest, thereby indicating the location of a defect or failure mechanism within that area. The method can further comprise a step of polishing the semiconductor die on the device side thereof down to a first metal layer which comprises a plurality of vias.

The step of directing the beam of charged particles at the device side of the semiconductor die can comprise directing a beam of electrons having an energy of generally about one thousand electron volts (1 keV) or less, and a current of generally about 20 picoAmperes (20 pA) or less.

The step of scanning the beam of charged particles over the device side of the semiconductor die at the two different scan rates can comprise scanning the beam of charged particles at each scan rate for sufficient time to establish a positive or negative charge equilibrium on the device side of the semiconductor die.

The step of comparing the secondary particle emission from the device side of the semiconductor die at the two different scan rates can comprise forming secondary particle emission images of the device side of the semiconductor die at the two different scan rates, and comparing an image contrast in the secondary particle emission images at the two different scan rates. Alternately, the step of comparing the secondary particle emission from the device side of the semiconductor die at the two different scan rates can comprise forming secondary particle emission images of the device side of the semiconductor die at the two different scan rates and constructing a composite image therefrom. The steps of scanning the beam of charged particles over the device side of the semiconductor die at the two different scan rates and detecting the secondary particle emission from the device side of the semiconductor die can also be repeated multiple times for signal averaging.

The present invention further relates to a system for performing PVC on a device side of a semiconductor die. The PVC system comprises a vacuum chamber containing a charged particle beam generator and a secondary particle detector. A sample holder is insertable into the vacuum chamber to hold the device side of the semiconductor die facing the charged particle beam generator, with the device side of the semiconductor die being electrically isolated from any ground electrical connection. The semiconductor die can comprise either a bulk semiconductor substrate or a silicon-on-insulator (SOI) substrate, or other type of substrate or structure. The sample holder can comprise an electrically nonconductive material (e.g. glass or ceramic).

The charged particle beam generator can comprise an electron beam generator which generates an electron beam having an energy of generally less than or equal to 1 kilo electron volt ($\leq 1$ keV). In some instances, the electron beam can provide an energy in the range of 0.3-0.5 keV. The electron beam generally has a current of less than or equal to 20 picoAmperes ($\leq 20$ pA).

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings:

FIG. 6A show a reflected-light image of a portion of a third IC fabricated on a SOI substrate which has a gate leakage defect therein.

FIG. 6B shows a FSPVC image of the portion of the SOI IC in FIG. 6A obtained with a relatively fast scan rate, with the defective gate being identified as being connected to the via labelled 1 which has a much brighter image contrast as compared to vias labelled 2 and 3 which are connected to non-defective transistor gates.

DETAILED DESCRIPTION OF THE INVENTION

Figure 1:
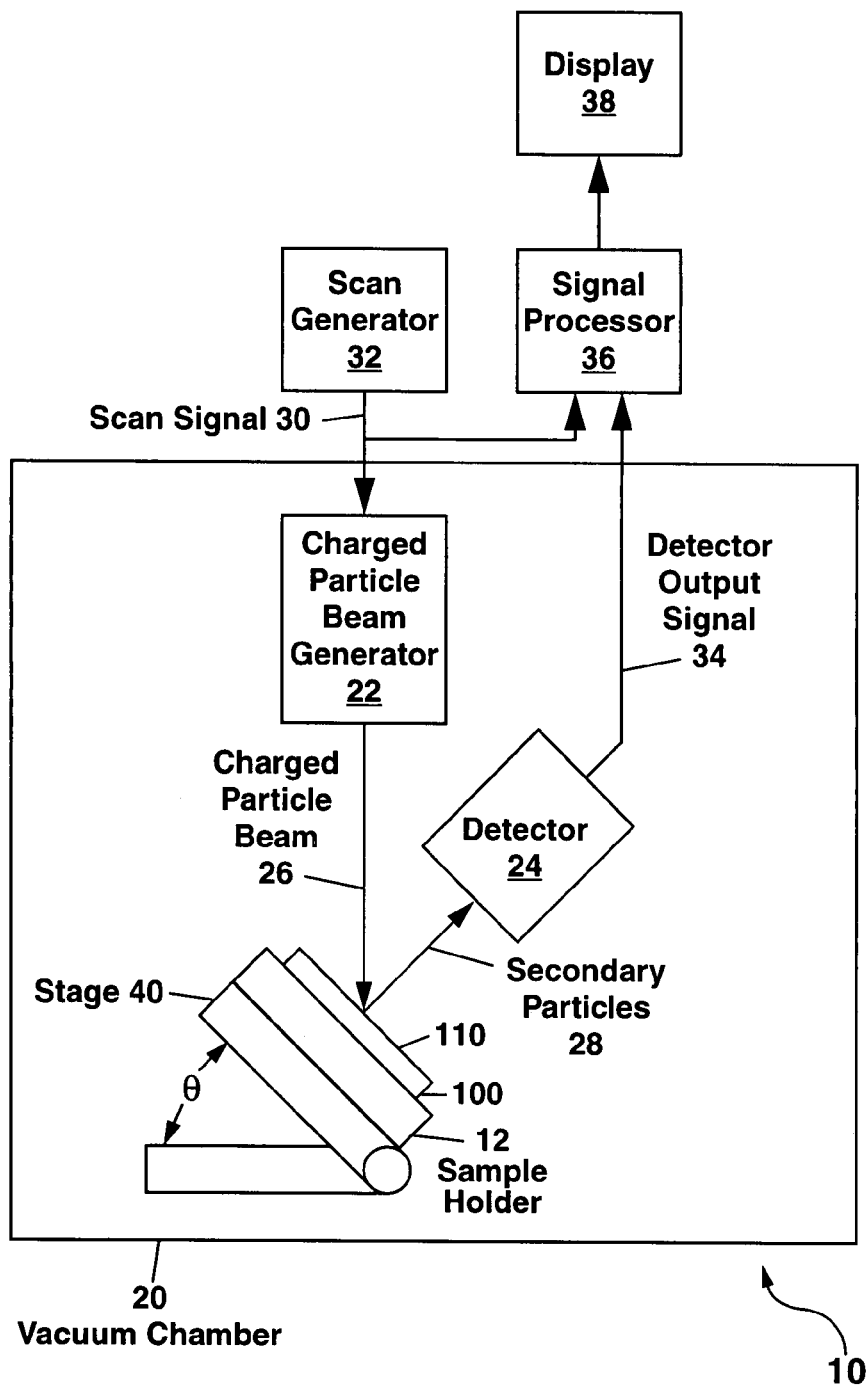
FIG. 1 shows a schematic diagram of a floating-substrate passive voltage contrast (FSPVC) system according to the present invention.

FIG. 1 shows a schematic diagram of a floating-substrate PVC system 10 of the present invention which is referred to hereinafter as a FSPVC system 10. The term "floating-substrate" as used herein refers to a semiconductor substrate 100 (also termed a semiconductor die) having a device side 110 on which an IC is formed comprising a plurality of interconnected transistors, with the device side 110 being maintained in an electrically-floating condition without any ground electrical connection (i.e. without any connection to a ground electrical potential either directly, or through a power supply). In the case of a bulk semiconductor substrate 100, the substrate itself must be electrically-floating since the device side 110 is an integral part of the substrate 100. In the case of a SOI substrate 100', the device side 110' is electrically isolated from the remainder of the substrate so that only the device side 110' need be electrically floating.

To provide a "floating substrate" for a semiconductor die which comprises a bulk semiconductor substrate 100, the substrate 100 can be mounted on a sample holder 12 that is electrically-insulating (e.g. comprising an electrically-insulating material such as glass or ceramic or any other type of electrically-insulating material that is suitable for use in a vacuum system). Alternately, the bulk semiconductor substrate 100 can be mounted on a sample holder 12 that is electrically conducting in such a way that the substrate 100 is electrically isolated from the sample holder 12 which may be electrically grounded. This can be done, for example, by attaching the substrate 100 to the sample holder 12 with an electrically-insulating adhesive (e.g. a non-conducting epoxy), or by mounting the substrate 100 on another substrate (e.g. a portion of a silicon wafer) using the electrically-insulating adhesive. When a substrate 100 is located within an IC package (e.g. comprising an electrically-insulating material such as glass, ceramic, plastic, etc.), the substrate 100 can be a "floating substrate" when no electrical connections are made to the IC package.

Figure 2:
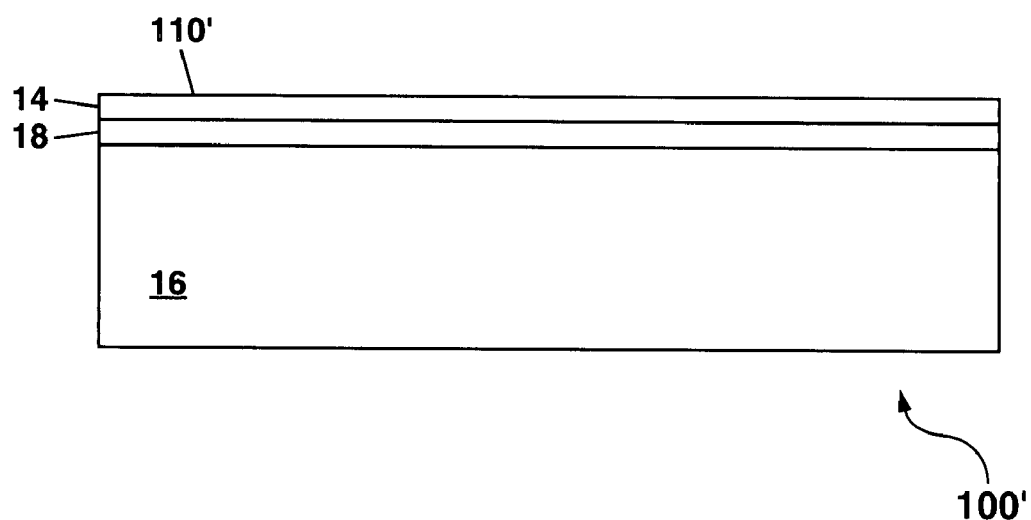
FIG. 2 shows a schematic cross-section view of a silicon-on-insulator (SOI) substrate.

In the case of a silicon-on-insulator (SOI) substrate 100' as shown in FIG. 2, the SOI substrate 100' comprises a silicon device layer 14 (also termed a body) having a device side 110' wherein the IC is formed. The silicon device layer 14 is separated from an underlying silicon substrate 16 by an intervening oxide layer 18 comprising silicon dioxide (also termed buried oxide or simply "box"). The oxide layer 18 electrically isolates the silicon device layer 14 and the device side 110' from the underlying silicon substrate 16. Thus, so long as no ground electrical connection (or power supply connection) is made to the silicon device layer 14, then the device side 110' of a SOI substrate 100' will be maintained in an electrically-floating condition regardless of whether or not the sample holder 12 is electrically grounded. When the SOI substrate 100' is contained within an IC package, the substrate 100' will be electrically-floating when no electrical connections are made to the IC package.

Returning to FIG. 1, the FSPVC system 10 includes a vacuum chamber 20 wherein a charged particle beam generator 22 (i.e. an electron beam source or ion beam source) is located together with a secondary particle detector 24. The sample holder 12, which can be inserted into the vacuum chamber 20 after mounting the bulk semiconductor substrate 100 or SOI substrate 100' thereon, holds the substrates 100 or 100' with the device side 110 or 110' in a path of an incident charged particle beam 26 from the generator 22.

The incident charged particle beam 26 upon impacting the device side 110 or 110' produces secondary particles 28 (i.e. secondary electrons or ions) which can be detected with the secondary particle detector 24. As the incident charged particle beam 26 is scanned over a portion of the device side 110 or 110' in response to a scan signal 30 provided to the charged particle beam generator 22 by a scan generator 32, an output signal 34 from the detector 24, which is proportional to the amount of secondary particles 28 detected, can be provided to a signal processor 36 and used to generate a FSPVC image of the portion of the device side 110 or 110' which is being scanned. The FSPVC image can then be provided to a display 38 in real time, or after an image is digitally acquired and stored in the signal processor 36. Multiple images can be acquired for signal averaging. Additionally, multiple images can be acquired for different scan rates of the incident charged particle beam 26 and displayed individually or combined to form a composite image.

In FIG. 1, the sample holder 12 can be located on a stage 40 which can be optionally tilted at an arbitrary angle θ. Tilting of the device side 110 or 110' at an angle to the incident charged particle beam 26 is useful for increasing the amount of secondary particle emission since this decreases a penetration depth of the beam 26 into the substrate 100 or 100'.

A number of examples of use of the FSPVC system 10 and method of the present invention will now be described. Those skilled in the art will understand that the FSPVC system 10 and method of the present invention can also be used for other types of defects and failure mechanisms beyond those described in the examples.

Figure 3:
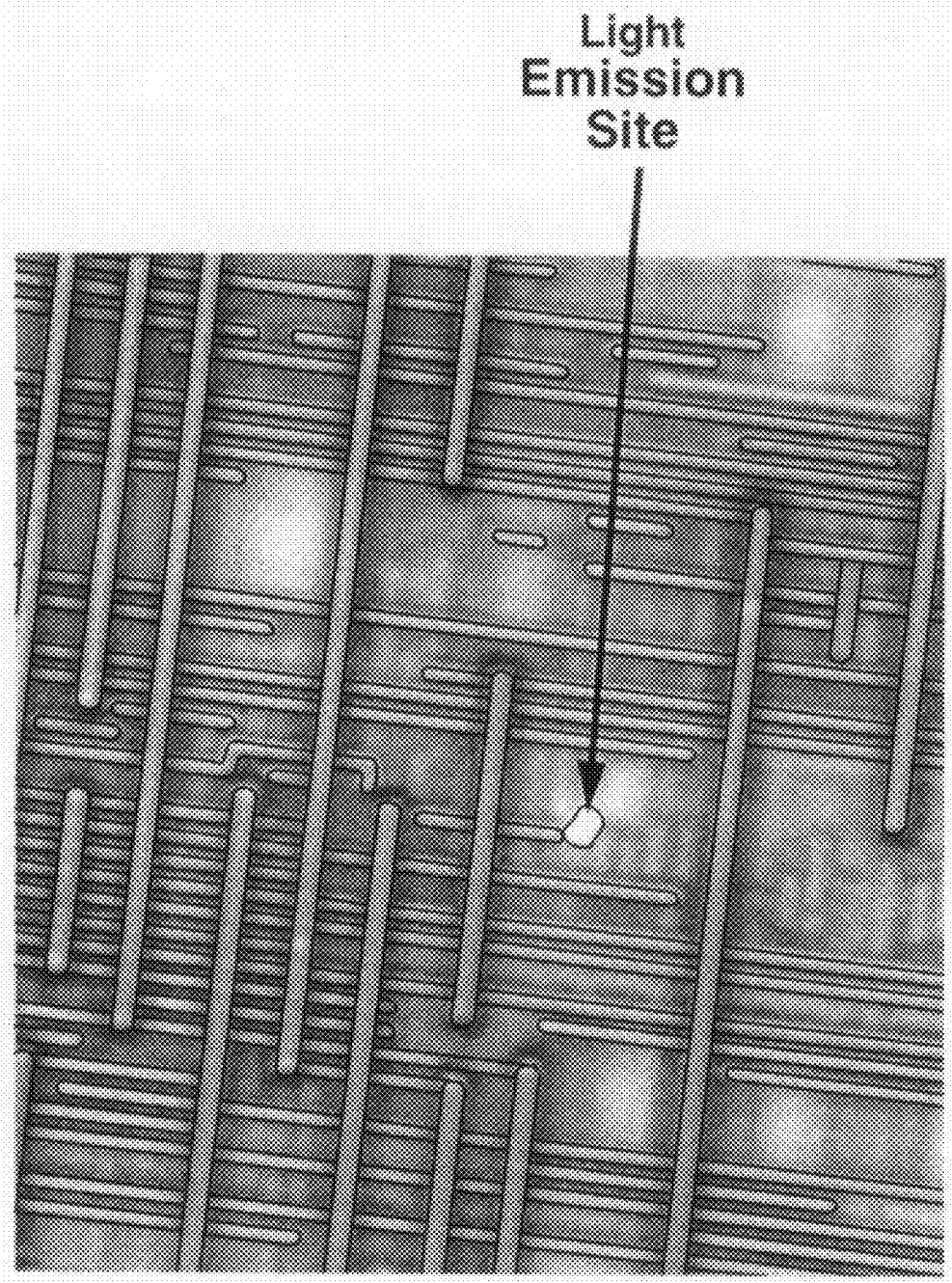
FIG. 3 shows a combined light emission microscopy and reflected-light image of a portion of an IC to illustrate how light emission can be used to determine the approximate location of a defect within the IC.

For each example described herein, light emission microscopy, which is well known in the art, can be initially used in combination with a reflected-light image to narrow down the location of a transistor gate leakage defect or other type of defect or failure mechanism to a general location which can contain, for example, only a few transistors in the IC. Light emission microscopy involves biasing the IC and detecting light at visible or near infrared wavelengths due to "hot" carrier production resulting from locally high electric fields at the location of defects such as gate oxide leakage and junction leakage. Light emission microscopy used in combination with a reflected-light image is generally not sufficient by itself to determine the exact transistor or other structure having a defect or failure mechanism therein due to a close spacing between adjacent transistors which can be less than the wavelength of the light emission. Also, scattering of the light from the various levels of metallization makes it difficult to precisely pinpoint where the light originates on the IC. An example of a combined light emission microscopy and reflected-light image for a portion of an IC is shown in FIG. 3 where a bright light emission site indicated by the arrow 5 indicates the approximate location of a defect in this IC.

Once the approximate location of a defect or failure mechanism within the IC has been determined by light emission microscopy, the IC can be de-processed to remove each layer of metal interconnections down to a first metal layer (i.e. a first-deposited metallization) which can comprise a plurality of tungsten vias (also termed plugs) which extend downward through an interlevel dielectric (i.e. an oxide insulating layer which comprises, for example, silicon dioxide, or a silicate glass such as TEOS which can be deposited from the decomposition of tetraethylortho silicate by plasma enhanced chemical vapor deposition) and are electrically connected to the gates, drains, sources of each transistor or other structure located therebeneath. This can be done by polishing the semiconductor die 100 or 100' on the device side thereof to remove the various layers of metal interconnections shown in FIG. 3. This de-processing electrically isolates individual transistors, and allows access to the transistors and vias connected thereto by the charged particle beam 26.

When the IC is formed on a bulk semiconductor substrate 100, the substrate 100 can then be mounted on an electrically-insulating sample holder 12 which can comprise, for example, a glass slide. This ensures electrical isolation from any ground electrical connection. Alternately, an electrically non-conducting adhesive (e.g. epoxy) can be used between the bulk semiconductor device and an electrically-conducting sample holder 12 to ensure electrical isolation from any ground electrical connection. No external bias is applied to the IC during FSPVC analysis.

Figure 4A:
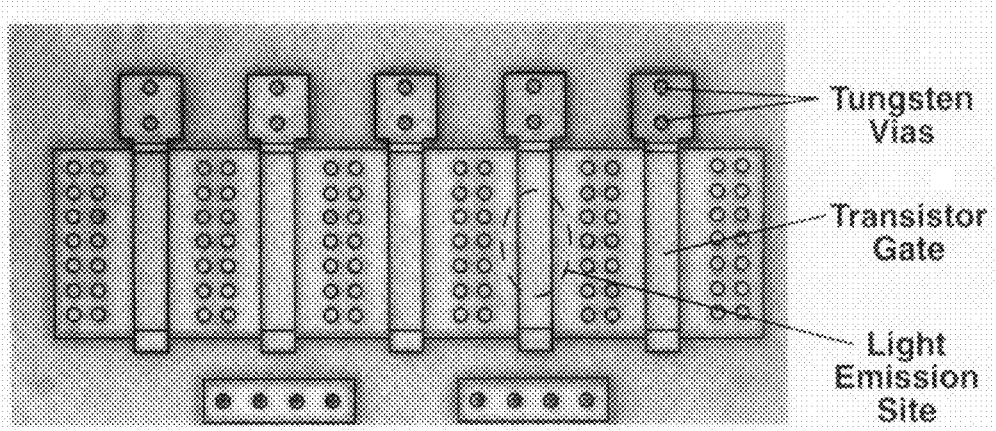
FIG. 4A shows a reflected-light image of a portion of an IC fabricated on a bulk semiconductor substrate containing a defect which is a gate leakage defect.
Figure 4B:
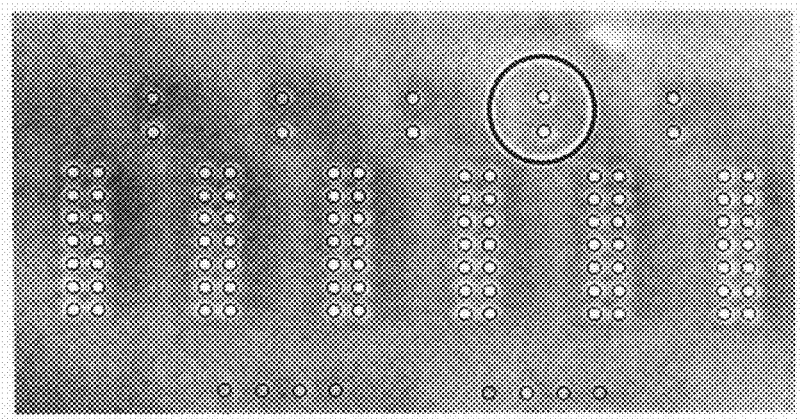
FIG. 4B shows a FSPVC image of the portion of the IC in FIG. 4A obtained with a relatively fast scan rate, with the tungsten vias, which are connected to a defective transistor gate, appearing brighter than adjacent vias which are connected to non-defective transistor gates. A black circle has been added to the FSPVC image to identify the vias connected to the defective transistor gate.
Figure 4C:
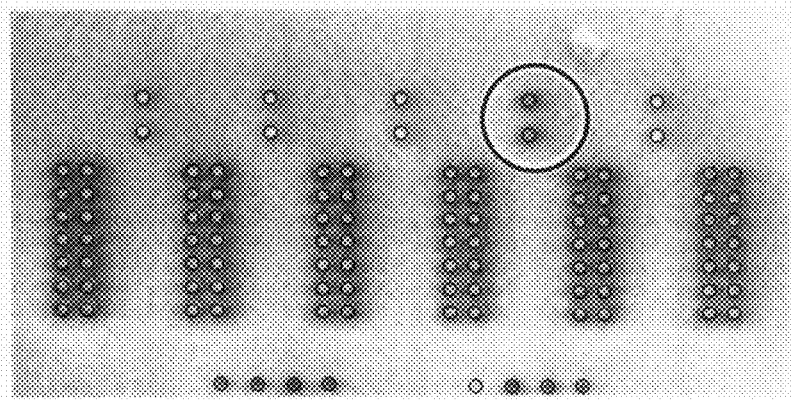
FIG. 4C shows a FSPVC image of the same portion of the IC in FIGS. 4A and 4B obtained with a relatively slow scan rate to illustrate the image reversal that can occur at the location of the vias which are connected to the defective transistor gate, with the encircled vias now appearing darker than the adjacent vias which are connected to the non-defective transistor gates.

FIGS. 4A-4C show a first example to illustrate operation of the FSPVC system 10 and method of the present invention as applied to CMOS ICs formed on a bulk semiconductor substrate 100 comprising silicon. FIG. 4A shows a reflected light image of a portion of the IC after de-processing. The portion of the IC comprises a plurality of transistors formed side by side, with each transistor having a polysilicon gate connected to a pair of tungsten vias. The location of the light emission site determined from light emission microscopy is indicated by a dashed oval in FIG. 4A.

FIG. 4B shows an image of the portion of the IC in FIG. 4A obtained using the FSPVC system 10 of the present invention. For the image of FIG. 4B, the FSPVC system 10 was operated with an electron beam energy of 1.0 keV (kilo-electron volts) with the substrate 100 being untilted with respect to the incident electron beam 26. A raster scan rate of the electron beam 26 over the portion of the IC shown in FIG. 4A was varied between a relatively fast san rate in the range of 20-30 frames per second, for example, and a relatively slow scan rate in the range of 1/30-1/4 frame per second, for example. The different scan rates are used to determine differences in contrast of the FSPVC images which can occur due to different equilibrium charging conditions on the device surface 110. The FSPVC images at each scan rate, which are produced from detected secondary particles 28 (e.g. electrons), can be captured and stored using the signal processor 36, which can comprise a digital imaging acquisition system, and provided to the display 38.

For the relatively fast scan rate, the device side 110 of the portion of the IC being analyzed can be pre-conditioned by repeatedly scanning the electron beam 26 until an equilibrium is reached in the contrast of a real-time image of the device side 110 which can be monitored on the display 38. When the electron beam scan rate is relatively fast, this pre-conditioning establishes a positive equilibrium charge on an exposed surface of the oxide insulating layer which is considered herein to be a part of the device side 110 of the IC. The establishment of the positive equilibrium charge is due to a relatively low flux of electrons impinging on the exposed surface of the oxide insulating layer which allows secondary electrons 28 to be readily emitted from this surface thereby leaving a net positive charge on the surface. When the electron beam scan rate is relatively slow, the pre-conditioning establishes a negative equilibrium charge on the exposed surface of the oxide insulating layer as the incident flux of electrons increases beyond the oxide insulating layer's ability to emit an increasing number of secondary electrons 28 thereby leaving a net negative charge on the surface. The positive equilibrium charge on the surface of the oxide insulating layer provides a relatively dark background for the FSPVC image of FIG. 4B as compared to the background of the oxide insulating layer in FIG. 4C which is lighter due to a negative equilibrium charge.

The equilibrium charge at vias electrically connected to the transistor gates and other elements in the IC will depend on whether the gates, drains, sources, etc., are electrically floating or electrically connected to an underlying silicon well or diffusion region. For the electrically-floating gates, which are isolated by a gate oxide, the relatively fast scan rate produces a positive equilibrium charge on the vias connected to the floating gates, with the positive equilibrium charge being smaller than that of the surface of the oxide insulating layer due to some of the positive charge being conducted from the vias to the electrically-floating transistor gates. Similarly, a relatively slow scan rate results in a negative equilibrium charge on the vias connected to the electrically-floating transistor gates which is smaller than the negative equilibrium charge on the surface of the oxide insulating layer.

In the case of electrically-shorted gates with a leakage path through the gate oxide, the positive equilibrium charge on the vias connected to these gates is less than that of the electrically-floating gates for the relatively fast scan rate since more of the positive charge is conducted through the electrical short circuit to the underlying silicon well or diffusion region which acts as a "virtual ground." The term "virtual ground" as defined according to the present invention is a localized electron source or sink which is electrically isolated from ground electrical potential, and which can provide a small amount of charge, or receive and dissipate a small amount of charge without any external charge source other than the single charged particle beam 26 shown in FIG. 1. With FSPVC, the voltage contrast of electrical conductors (e.g. vias) which are shorted to "virtual grounds" is different from that of electrically isolated conductors. For a relatively slow scan of the electron beam 26 over an electrically-shorted gate due to a gate leakage defect therein, a positive charge can flow from the silicon well or diffusion region back to the transistor gate and tungsten via to positively charge the via. The difference in charging of the vias connected to an electrically-shorted gate compared to the vias connected to an electrically-floating gate provides a different voltage contrast between these two types of gates which shows up in the FSPVC images of FIGS. 4B and 4C and allows the location of the electrically-shorted gate to be pinpointed.

Once equilibrium is reached for a relatively slow or fast electron beam scan rate, the FSPVC image can be acquired with the signal processor 36 and stored and/or displayed. For the relatively fast scan rate, an image capture rate of, for example, 1 second per frame can be used. For the relatively slow scan rate, the image capture rate can be, for example, 4 to 20 seconds per frame. Additionally, multiple images can be acquired for each scan rate to improve the image resolution. This is especially useful when the electron beam energy is low (e.g. 0.3-0.5 keV) to provide an enhanced contrast between the electrically-shorted and electrically-floating gates.

The resulting FSPVC image for the relatively fast scan rate is shown in FIG. 4B for an electron beam energy of 1 keV and an electron beam current of 2.2 pA. In the FSPVC image of FIG. 4B, the two tungsten vias, which are located within the black circle for identification, are electrically connected to a short-circuited polysilicon transistor gate and therefore exhibit an increased brightness as compared to the other pairs of tungsten vias connected to the adjacent transistor gates which are electrically floating.

As the flux in the electron beam 26 is further increased, the defective gate will become less and less distinguishable from the remaining gates at the relatively high scan rate as the positive equilibrium charge becomes about the same for the electrically-shorted and electrically-floating gates. This results from a charge saturation of the "virtual ground" to which the electrically-shorted gate is connected which can occur as the electron beam current and/or energy is increased. As an example, when the electron beam energy is 2 keV and the electron beam current is less than 20 pA, no contrast difference is observed between the electrically-shorted and electrically-floating gates. As another example, when the electron beam energy is 0.5 keV and the electron beam current is 30 pA, no contrast difference is observed between the electrically-shorted and electrically-floating gates at either the relatively fast or relatively slow scan rates.

Generally, the electron beam energy for FSPVC is generally about 1 keV or less, and can be in the range of 0.3-0.5 keV to further increase the contrast between the defective gate in FIG. 4B and the remaining non-defective gates although the FSPVC image resolution at this low electron energy will generally be poorer due to fewer detected secondary electrons 28. The electron beam current in the FSPVC system 10 and method of the present invention is preferably maintained below about 20 picoAmperes (pA), and will generally be in the range of 1.5-20 pA, to provide a relatively low flux of electrons on the device surface 110 or 110' of the IC being analyzed. The exact electron beam energy and current can be learned from practice of the present invention and will depend upon the scan rate, the type of device (either bulk semiconductor substrate, or SOI substrate) being analyzed, and the type of interlevel dielectric used in the device. Generally, the electron beam energy and current are adjusted while observing a FSPVC image of an IC to obtain the best contrast between the electrically-shorted and electrically-floating gates in the vicinity of the light emission site where a defect such as a defective transistor gate is located.

FIG. 4C shows another FSPVC image for the same portion of the IC in FIGS. 4A and 4B, but taken at the relatively slow scan rate. In this case, the device surface 110 can be preconditioned by exposure to the electron beam 26 as previously described, with the electron beam 26 being raster scanned at a rate in the range of 1/30 to 1/4 frame per second. The FSPVC image can then be acquired with a slow capture rate in the range of 4 to 20 seconds per frame. A higher image magnification and/or signal averaging using multiple images can also be used to increase the clarity of the FSPVC image.

For the FSPVC image in FIG. 4C, the electron beam energy is 1 keV, and the electron beam current is 1.5 pA. For these conditions, the tungsten vias, which are located within the black circle for identification and which are connected to the electrically-shorted gate, appear much darker than the vias connected to the remaining electrically-floating gates. In FIG. 4C, the vias connected to the drain/source regions of the transistors also appear relatively dark since the drain/source regions of the transistors also act as "virtual grounds."

The difference in contrast between the vias located within the black circles for the defective gate in FIGS. 4B and 4C is striking when compared to that of the adjacent vias connected to the other non-defective gates. Thus, a comparison of the FSPVC image contrast for the relatively fast scan rate and the relatively slow scan rate can provide a method for accurately pinpointing the location of the defective gate due to a reversal in the FSPVC image contrast which can occur, especially for ICs fabricated on bulk semiconductor substrates. The two different scan rates can be selected to provide sufficient differences in the electron beam flux to produce a different polarity for the equilibrium charge on the surface of the oxide insulating layer as previously described. These two different scan rates can be in a ratio of about 80:1 or more (e.g. a relatively fast scan rate of 20 frames per second or more, and a relatively slow scan rate of 1/4 frame per second or less) according to the present invention. The secondary electron emission can be detected and stored or displayed for the two different scan rates once an equilibrium has been reached for the charge on the surface of the oxide insulating layer. The differences in FSPVC contrast for the two different scan rates can then be compared to locate an area of the device side of the IC where a change (i.e. difference) in the secondary electron emission is largest for the two different scan rates in order to pinpoint the location of a defect. A comparison of the secondary electron emission for the two different scan rates can be made using secondary electron images (i.e. the FSPVC images as shown in the example of FIGS. 4A-4C) of the device side 110 by comparing the image contrast at the two different scan rates. This can be done visually, for example, by looking at the FSPVC images in FIGS. 4B and 4C on the display 38. Vias connected to transistor gates which show the largest changes in contrast for the two different scan rates will indicate transistor gates having gate leakage defects therein.

A composite image can also be electronically or computationally generated in the signal processor 36 or in a computer connected thereto from the FSPVC images generated at the two different scan rates. This can be done, for example, by adding or subtracting the images at the two different scan rates. Those skilled in the art will understand that multiple images can be acquired and signal averaged at each scan rate to enhance the image resolution prior to generating the composite image.

Once the location of a defect has been precisely pinpointed using the FSPVC system 10 and method of the present invention, the exact nature of the defect can be determined, if needed, after removal of the substrate 100 from the FSPVC system 10. This can be done by electrically grounding the substrate (or device layer 14 in the case of a SOI substrate 100') and contacting the defective transistor gate with a submicron probe to generate a current-vs.-voltage (I-V) curve for that gate. Adjacent transistor gates can also be probed to verify that they are non-defective. A transistor gate which is electrically shorted to a drain/source region in the defective transistor will show a resistive I-V curve which is substantially linear; whereas a transistor gate which is electrically shorted to the substrate 100 will show a characteristic diode-type I-V curve.

Figures 5A, 5B:
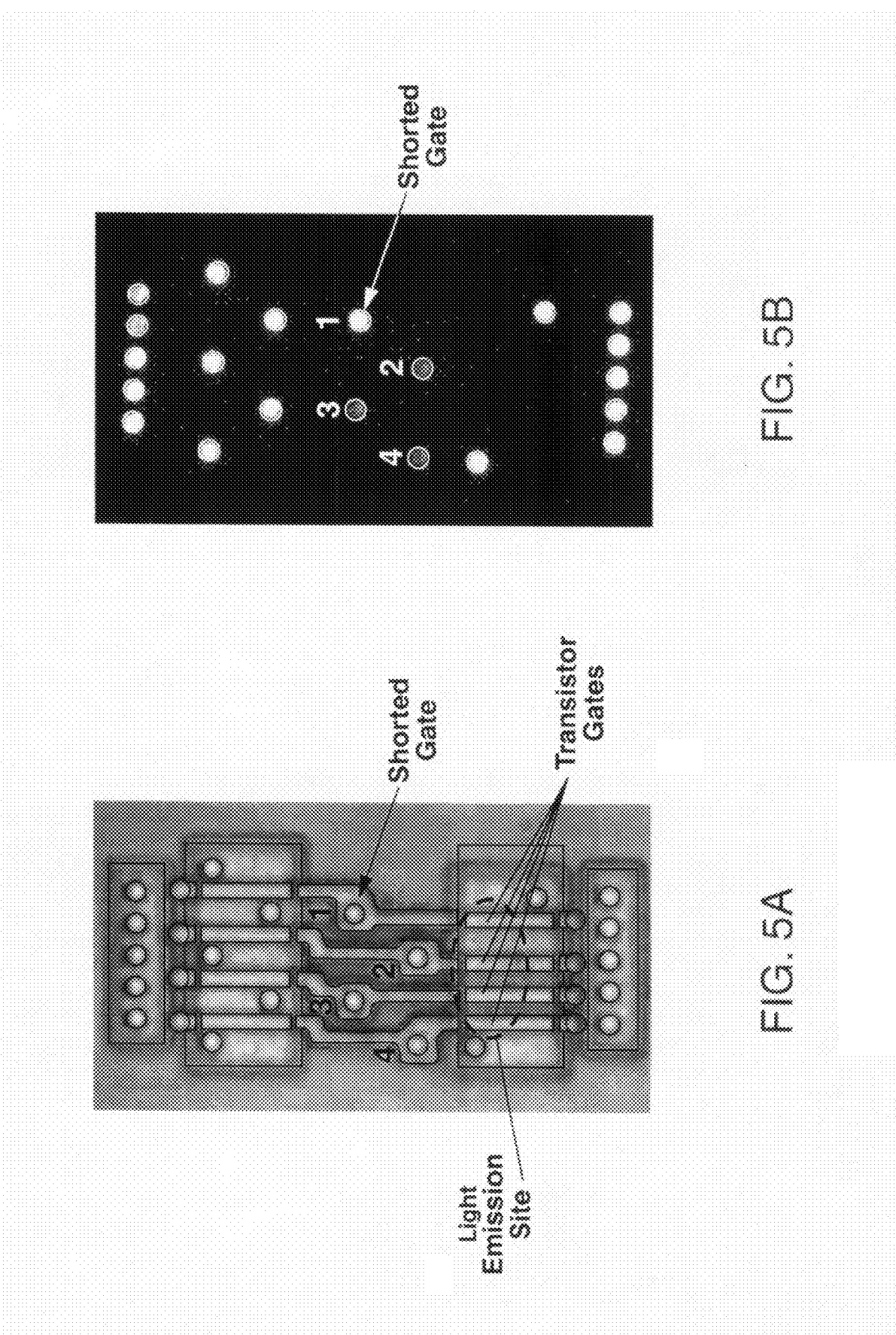
FIG. 5A shows a reflected-light image of a portion of a second IC fabricated on a bulk semiconductor substrate which has a gate leakage defect therein.
FIG. 5B shows a FSPVC image of the portion of the IC in FIG. 5A obtained with a relatively fast scan rate, with the defective gate being identified as being connected to the via labelled 1 which has a much brighter image contrast as compared to the vias labelled 2, 3 and 4 which are connected to non-defective transistor gates.

FIGS. 5A and 5B show, respectively, a reflected-light image and a FSPVC image of a portion of another IC formed on a bulk semiconductor substrate 100. In this second example of the present invention, the location of a light emission site from light emission microscopy is indicated by a dashed oval which overlaps the gates of four adjacent transistors, with each transistor gate being electrically connected to a via identified as 1, 2, 3 or 4 in FIG. 5A. The FSPVC image in FIG. 5B obtained with an electron beam energy of about 1 keV, an electron beam current of 22 pA and a relatively fast scan rate shows that the transistor gate connected to the via labelled 1 has a short-circuit gate leakage defect since this via appears much brighter (i.e. whiter) than the vias labelled 2, 3 and 4 which are connected to electrically-floating gates. This example of the present invention shows that, in many cases, it is possible to obtain sufficient contrast between a via connected to a defective transistor gate and other vias connected to non-defective transistor gates so that only a single scan rate need be used to precisely locate any defective transistor gates within an IC.

FIGS. 6A and 6B show that the FSPVC system 10 and method can also be applied to ICs formed on SOI substrates 100'. The ICs on SOI substrates 100' can be initially analyzed using light emission microscopy to as previously described to find the approximate location of any gate leakage defects therein. The ICs can then be de-processed as described previously to remove the various layers of interconnect metallization down to the first metal layer which comprises the tungsten vias. This also leaves intact at least a portion of the oxide insulating layer covering the transistors in the IC.

Operation of the FSPVC system 10 and method of the present invention for ICs on a SOI substrate 100' then proceeds in a manner similar to that described previously for bulk semiconductor substrate devices except that the relatively slow scan rate of the electron beam 26 to produce a high flux of electrons on the device surface 110' is generally not used. The reason for this is that a FSPVC contrast reversal is generally not seen for a SOI substrate device under high electron flux conditions due to a smaller "virtual ground" in the SOI substrate device. The smaller "virtual ground" for the SOI device is due to a smaller thickness of the silicon device layer 14 as compared to the thickness of the silicon well and diffusion regions in the bulk semiconductor substrate devices. Additionally, the transistors on the SOI substrate 100' described hereinafter have slightly smaller feature sizes being fabricated with 0.35 μm CMOS technology as compared with the bulk semiconductor substrate devices in FIGS. 4 and 5 which utilize 0.5 μm CMOS technology.

FIG. 6A shows a portion of a de-processed IC on a SOI substrate 100' which consists of three transistor gates connected to the tungsten vias labelled 1, 2 and 3. For this SOI device, the light emission site as determined by light microscopy image spanned all three of the transistor gates as indicated by the dashed oval in FIG. 6A. A FSPVC image of the SOI device of FIG. 6A obtained with a relatively fast scan rate for the electron beam 26 and an electron beam energy of 1 keV and an electron beam current of 19 pA is shown in FIG. 6B. In the FSPVC image, the defective transistor gate is identified as being the gate connected to the tungsten via labelled 1 (indicated by the arrow). The via connected to the defective transistor gate in FIG. 6B provides an image contrast that is much brighter than that of vias 2 and 3 which are connected to non-defective transistor gates. Subsequent electrical probing confirmed that the transistor gate connected to via 1 had a short-circuit gate leakage defect.

Although the charged particle beam 26 has been described herein as being an electron beam, in other embodiments of the present invention, the charged particle beam 26 can comprise an ion beam (e.g. comprising gallium ions). The exact ion beam energy, ion beam current and ion beam scan rate needed for FSPVC analysis of an IC on a bulk semiconductor substrate 100 or on a SOI substrate 100' can be determined from practice of the present invention.

The present invention can also be used to detect defects and failure mechanisms on ICs formed on other types of substrates, including substrates formed of sapphire, diamond, silicon carbide, etc. The present invention can also be used for wafer-level testing to analyze for defects, failure mechanisms, or gate oxide integrity. Additionally, the present invention can be used to detect defects and failure mechanisms in other types of structures (e.g. capacitors formed between metal layers) which may or may not include a substrate.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A method for measuring passive voltage contrast on a device side of a semiconductor die to locate any defects or failure mechanisms therein comprising the steps of:
    polishing the semiconductor die on the device side thereof down to a first metal layer comprising a plurality of vias;
    maintaining the device side of the semiconductor die in an electrically-floating condition without any ground electrical connection;
    directing a beam of charged particles at the device side of the semiconductor die, and scanning the beam of charged particles over the device side of the semiconductor die; and
    detecting a secondary particle emission from the device side of the semiconductor die.

2. The method of claim 1 wherein the semiconductor die comprises a bulk semiconductor substrate.

3. The method of claim 1 wherein the semiconductor die comprises a silicon-on-insulator (SOI) substrate.

4. The method of claim 1 wherein maintaining the device side of the semiconductor die in the electrically-floating condition comprises mounting the semiconductor die on an electrically-insulating sample holder.

5. The method of claim 1 wherein maintaining the device side of the semiconductor die in the electrically-floating condition comprises providing an electrically-insulating adhesive between the semiconductor die and an electrically-conducting sample holder.

6. The method of claim 1 wherein directing the beam of charged particles at the device side of the semiconductor die comprises directing a beam of electrons having an energy of less than or equal to one thousand electron volts ($\leq 1$ keV), and a current of less than or equal to 20 picoAmperes ($\leq 20$ pA).

7. A method for measuring passive voltage contrast on a device side of a semiconductor die to locate any defects or failure mechanisms therein comprising the steps of:
    maintaining the device side of the semiconductor die in an electrically-floating condition without any round electrical connection;
    directing a beam of charged particles at the device side of the semiconductor die, and scanning the beam of charged particles over the device side of the semiconductor die at two different scan rates at two different times; and
    detecting a secondary particle emission from the device side of the semiconductor die.

8. The method of claim 7 wherein the two different scan rates are in a ratio of at least 80:1.

9. The method of claim 7 wherein the steps of scanning the beam of charged particles over the device side of the semiconductor die at the two different scan rates and detecting the secondary particle emission from the device side of the semiconductor die are repeated multiple times for signal averaging.

10. The method of claim 1 wherein scanning the beam of charged particles over the device side of the semiconductor die comprises scanning the beam of charged particles for sufficient time to establish a positive or negative equilibrium charge on the device side of the semiconductor die.

11. The method of claim 1 wherein detecting the secondary particle emission from the device side of the semiconductor die comprises detecting the secondary particle emission to locate a defect or failure mechanism in a transistor located on the device side of the semiconductor die.

12. A method for measuring passive voltage contrast on a device side of a semiconductor die comprising the steps of:
    maintaining the device side of the semiconductor die in an electrically-floating condition without any ground electrical connection while directing a beam of charged particles at the device side of the semiconductor die;
    scanning the beam of charged particles over the device side of the semiconductor die at two different scan rates;
    detecting a secondary particle emission from the device side of the semiconductor die at the two different scan rates; and
    comparing the secondary particle emission from the device side of the semiconductor die at the two different scan rates to locate an area of the device where a difference in the secondary particle emission at the two different scan rates is largest, thereby indicating the location of a defect or failure mechanism within that area.

13. The method of claim 12 further comprising a step of polishing the semiconductor die on the device side thereof down to a first metal layer which comprises a plurality of vias.

14. The method of claim 12 wherein the two different scan rates are in a ratio of at least 80:1.

15. The method of claim 12 wherein directing the beam of charged particles at the device side of the semiconductor die comprises directing a beam of electrons having an energy of less than or equal to one thousand electron volts ($\leq 1$ keV), and a current of less than or equal to 20 picoAmperes ($\leq 20$ pA).

16. The method of claim 12 wherein comparing the secondary particle emission from the device side of the semiconductor die at the two different scan rates comprises forming secondary particle images of the device side of the semiconductor die at the two different scan rates, and comparing all image contrast in the secondary particle emission images at the two different scan rates.

17. The method of claim 12 wherein comparing the secondary particle emission from the device side of the semiconductor die at the two different scan rates comprises forming secondary particle emission images of the device side of the semiconductor die at the two different scan rates and constructing a composite image therefrom.

18. The method of claim 12 wherein the step of scanning the beam of charged particles over the device side of the semiconductor die at the two different scan rates comprises scanning the beam of charged particles at each scan rate for sufficient time to establish a positive or negative charge equilibrium on the device side of the semiconductor die.

19. The method of claim 12 wherein the steps of scanning the beam of charged particles over the device side of the semiconductor die at the two different scan rates and detecting the secondary particle emission from the device side of the semiconductor die are repeated multiple times for signal averaging.

20. A system for performing passive voltage contrast on a device side of a semiconductor die, comprising:
    a vacuum chamber containing a charged particle beam generator and a secondary particle detector, with the charged particle beam generator providing a charged particle beam which is scanned over a portion of the device side of the semiconductor die at two different scan rates;
    a sample holder which is insertable into the vacuum chamber to hold the device side of the semiconductor die facing the charged particle beam generator, with the device side of the semiconductor die being electrically isolated from any ground electrical connection; and
    a signal processor to receive a detector output signal from the secondary particle detector for the two different scan rates and generate therefrom, in combination with a display, a passive voltage contrast image of the portion of the device side of the semiconductor die to locate any defects or failure mechanisms in that portion of the device side of the semiconductor die.

21. The system of claim 20 wherein the semiconductor die comprises a bulk semiconductor substrate.

22. The system of claim 20 wherein the semiconductor die comprises a silicon-on-insulator (SOI) substrate.

23. The system of claim 20 wherein the charged particle beam generator comprises an electron beam generator which generates an electron beam having an energy of less than or equal to 1 kilo electron volt ($\leq 1$ keV).

24. The system of claim 23 wherein the electron beam has a current of less than or equal to 20 picoAmperes (pA).

25. The system of claim 20 wherein the sample holder comprises an electrically nonconductive material.

26. A system for performing passive voltage contrast on a device side of a semiconductor die which has been polished down to a first metal layer containing a plurality of vias, comprising:
    a vacuum chamber containing a charged particle beam generator and a secondary particle detector, with the charged particle beam generator providing a charged particle beam which is scanned over a portion of the device side of the semiconductor die;
    a sample holder which is insertable into the vacuum chamber to hold the device side of the semiconductor die facing the charged particle beam generator, with the device side of the semiconductor die being electrically isolated from any ground electrical connection; and
    a signal processor to receive a detector output signal from the secondary particle detector and generate therefrom, in combination with a display, a passive voltage contrast image of the portion of the device side of the semiconductor die to locate any defects or failure mechanisms in that portion of the device side of the semiconductor die.

27. A system for performing passive voltage contrast on a device side of a semiconductor die which contains a plurality of electrically-isolated individual transistors, comprising:
    a vacuum chamber containing a charged particle beam generator and a secondary particle detector, with the charged particle beam generator providing a charged particle beam which is scanned over a portion of the device side of the semiconductor die;
    a sample holder which is insertable into the vacuum chamber to hold the device side of the semiconductor die facing the charged particle beam generator, with the device side of the semiconductor die being electrically isolated from any ground electrical connection; and
    a signal processor to receive a detector output signal from the secondary particle detector and generate therefrom, in combination with a display, a passive voltage contrast image of the portion of the device side of the semiconductor die to locate any defects or failure mechanisms in the electrically-isolated individual transistors.

28. The system of claim 27 wherein each transistor is connected to at least one electrical via.

* * * * *